United States Patent [19]
Kato et al.

[11] Patent Number: 5,951,374
[45] Date of Patent: Sep. 14, 1999

[54] METHOD OF POLISHING SEMICONDUCTOR WAFERS

[75] Inventors: Tadahiro Kato, Shirakawa; Hisashi Masumura, Fukushima-ken, both of Japan; Masami Nakano, Vancouver, Wash.; Hideo Kudo, Fukushima-ken, Japan

[73] Assignee: Shin-Etsu Handotai Co., Ltd., Tokyo, Japan

[21] Appl. No.: 08/789,046

[22] Filed: Jan. 28, 1997

[30] Foreign Application Priority Data

Jan. 31, 1996 [JP] Japan ................................ 8-015420
Jan. 21, 1997 [JP] Japan ................................ 9-008510

[51] Int. Cl.$^6$ .................................................. B24B 1/00
[52] U.S. Cl. ................................ 451/41; 451/57; 451/58; 451/288
[58] Field of Search ............................. 451/41, 285–289, 451/57, 58; 125/13.02; 438/692; 216/52

[56] References Cited

U.S. PATENT DOCUMENTS

| | | | |
|---|---|---|---|
| 5,157,877 | 10/1992 | Hashimoto | 451/41 |
| 5,429,711 | 7/1995 | Watanabe et al. | 216/52 |
| 5,700,179 | 12/1997 | Hasegawa et al. | 451/41 |
| 5,800,725 | 9/1998 | Kato et al. | 216/88 |

FOREIGN PATENT DOCUMENTS

| | | |
|---|---|---|
| 454362A2 | 10/1991 | European Pat. Off. . |
| 578351A1 | 1/1994 | European Pat. Off. . |
| 628992A2 | 12/1994 | European Pat. Off. . |

OTHER PUBLICATIONS

Abstract of Japanese Patent Publication No. 62033784, dated Feb. 13, 1987.
Abstract of Japanese Patent Publication No. 60228068, dated Nov. 13, 1985.
Abstract of Japanese Patent Publication No. 60025649, dated Feb. 8, 1985.
"Bromine/Methanol Polishing of <100> InP", 1046 Journal of the Electrochemical Society 137 (1990) Feb., No. 2, Manchester, NH, US.
"Ultra–Uniform CMP Using a Hydro Film Buffered Chuck (Hydro Chuck)", 2419A International Conference on Solid State Devices & Materials, Aug. 21–Aug. 24, 1995, Yokohama, JP (1995) Aug. 21, Tokyo, Japan.

Primary Examiner—Robert A. Rose
Assistant Examiner—George Nguyen
Attorney, Agent, or Firm—Nikaido, Marmelstein, Murray & Oram LLP

[57] ABSTRACT

A method of polishing semiconductor wafers includes a double side primary polishing step and a single side secondary polishing step using a single side polishing machine with a wafer holder including a template so bonded on a carrier plate as having one or more wafer receiving holes in which backing pads are disposed respectively for holding the back sides of the respective wafers fittingly received therein. This method makes it to possible to hold a plurality of wafers at one time due to batch processing to thereby improve the productivity, and decrease extremely the generation of the defective dimples in the front side of the wafer. Compared with conventional single side polishing, the flatness level of the wafer polished with the double side polishing machine in this method is improved.

16 Claims, 3 Drawing Sheets

METHOD OF POLISHING SEMICONDUCTOR WAFERS

BACKGROUND OF THE INVENTION

1. Field of the Invention

The present invention relates to a method of polishing semiconductor wafers, (hereinafter may be referred to, for brevity, as "wafer"), in particular, the improvement of a method of secondary or final polishing of semiconductor wafers.

2. Description of the Related Art

Recently, the production of semiconductor wafers in industrial scales has rapidly expanded to great proportions. In precise processing of the semiconductor wafers, the demand level toward flatness and roughness of the processed wafer surface is upgraded and a large sum of investment is necessary for production machinery, inspection mechanism and others. It is an important problem to achieve the improvement of productivity and the reduction of production cost.

Generally, in the case of polishing a semiconductor wafer with a single side polishing machine, the semiconductor wafer surface is polished while holding the wafer on a carrier plate. There ape used three methods for holding the wafer. The first holding method is a wax method wherein a wafer is attached to a carrier with appropriate tacky wax coated on one side of the wafer. The second one is a waxless method wherein a wafer is vacuum chucked. The third one is another waxless method wherein a wafer is attached with water by the use of uncompressible material composed of porous resins.

In the wax method, due to the use of tacky wax for holding a semiconductor wafer, there are the following drawbacks ① to ③. ① Time and labor are required for attaching the semiconductor wafer to a carrier. ② The semiconductor wafer to be processed by this method is contaminated with the residual wax. ③ The polished semiconductor wafer is likely to be contaminated or damaged when detaching the wafer from the carrier after polishing. Nonuniformity in the thickness of the coated wax is directly reflected to flatness and parallelism of the polished wafer. Therefore, uniformity in the thickness of the coated wax is necessary but wax coating is very difficult and requires a great amount of skill. Also, in recent times, the precision of the wafer specification is severe more and more because of fabrication of the integrated circuits higher in their density. Since the wax is coated manually, uniformity and reproducibility in the thickness of the wax per se must be limited. Moreover, this wax method requires removal of the wax after the polishing process which is a cause for disturbing the automation of this method.

However, the conventional waxless methods still have drawbacks in wafer bonding strength and parallelism and flatness of the polished wafer. In an effort to alleviate such drawbacks, there has been already proposed a waxless polishing method wherein a wafer is held with a backing pad excellent in wafer holding strength, parallelism and flatness and polished so that a polished wafer excellent in parallelism and flatness can be manufactured (Japanese Patent Laid-Open Publication No.4-13568).

Moreover, mirror polishing of a semiconductor wafer is often carried out with a double side polishing machine. In the double side polishing machine, since a wafer to be polished is held without wax as compared with a single side polishing machine, there is free from such drawbacks as exist in the single side polishing machine using wax for holding a wafer.

An example of the known double side polishing machine is described below together with FIGS. 5 and 6. FIG. 5 is a cross sectional schematic view of the double side polishing machine and FIG. 6 is a schematic plan view showing the double side polishing machine in which an upper polishing turn table is removed. In FIG. 5, the double side polishing machine 22 comprises a lower polishing turn table 24 and an upper polishing turn table 26 which are faced each other vertically. A lower polishing pad 24a is adhered on the upper surface of a lower polishing turn table 24 and an upper polishing pad 26a is adhered on the lower surface of the upper polishing turn table 26. The lower polishing turn table 24 and the upper polishing turn table 26 are rotated oppositely each other by a driving means (not shown). The lower polishing turn table 24 has a central gear 28 which is provided on the upper surface of the central portion thereof and an annular internal gear 30 which is provided in the proximity of the periphery thereof. Both the central gear 28 and the annular internal gear 30 are rotated independently of lower polishing turn table 24.

Reference numeral 32 denotes a carrier of disc shape which is supported between the upper surface of the lower polishing pad 24a of the lower polishing turn table 24 and the lower surface of the upper polishing pad 26a of the upper polishing turn table 26 and rotates and revolves slidably between the lower polishing pad 24a and the upper polishing pad 26a under the action of the central gear 28 and the internal gear 30.

The carrier 32 has a plurality of wafer holes 34. Wafers (W) which are to be polished are set in the wafer holes 34. When the wafers (W) are polished, a polishing agent is supplied to spaces between the wafers (W) and the polishing pads 24a, 26a via hole 38 formed in the upper polishing plate 26 from a nozzle 36. As the carrier 32 rotates and revolves, the wafers (W) rotates and revolve slidably between the lower polishing pad 24a and the upper polishing pad 26a, thereby both the sides of the wafers (W) being polished.

However, with the double side polishing machine, in order to improve the precision of the finished wafer surface, it is necessary to change the polishing pad to a soft polishing pad and the polishing agent to minute powdery abrasive grains, respectively, so that the frictional resistance between the semiconductor wafer and the polishing pad increases. The semiconductor wafer kept in the carrier of the double side polishing machine gets out of the carrier under the increased frictional resistance and the wafer is accidentally broken while polishing. The breakage of the wafer further leads to the damage of the polishing turn tables and the carrier whereby the manufacturing process disadvantageously suffers serious damage.

To obviate the above-mentioned drawbacks of mirror polishing operation of semiconductor wafers by the use of a double side polishing machine, there is proposed a method of polishing semiconductor wafers wherein mirror polishing of a semiconductor wafer comprises the first step for primary polishing of the wafer with a double side polishing machine having polishing surfaces which are formed by pouring a polishing agent to polishing pads and the second step for secondary polishing of one side of the wafer in slidable contact with a single side polishing machine which chucks by a vacuum chucking means another side of the wafer subjected to the primary polishing and has a polishing surface formed by pouring a polishing agent to a polishing pad softer than the polishing pads of the double side polishing machine so as to remove slight haze remaining in the one side due to the first step (Japanese Patent Publication No.1-22113). However, in the case of using a single side polishing machine of such a single wafer processing and single side chucking type as in the above proposed method of polishing wafers, there are following drawbacks. As the single side polishing machine can hold only one wafer at one time, the productivity thereof is low. Also, in the single side polishing machine, dust particles are often sandwiched between the chuking means and the chucking face (back side) of the wafer so that a lot of defective dimples in the front side of the wafer are generated and the configuration of the back side tends to be unfavorably transferred to the front side of the wafer.

SUMMARY OF THE INVENTION

The present invention has been made to obviate the foregoing problems. It is one object of the present invention to provide a novel method of polishing semiconductor wafers which makes it possible to hold a plurality of wafers at one time to thereby improve the productivity.

Another object of the present invention is to provide a method of polishing semiconductor wafers as stated above, wherein the generation of defective dimples in the front side of the wafer decreases extremely.

A further object of the present invention is to provide a method of polishing semiconductor wafers as stated above, wherein the flatness level of the wafer polished with the double side polishing machine is improved in comparison with the conventional single side polishing.

To attain the foregoing objects, in one aspect, the present invention provides a method of polishing semiconductor wafers which comprises the steps of: (a) double side primary polishing of both front and back sides of semiconductor wafers using a double side polishing machine; and (b) single side secondary polishing of the front sides of the double side polished wafers using a single side polishing machine while holding the back sides of the wafers with a wafer holder including a template so bonded on a carrier plate as having one or more wafer receiving holes in which backing pads are disposed respectively for holding the back sides of the respective wafers fittingly received therein.

After (b) the single side secondary polishing step has been completed, if necessary, the front sides of the wafers subjected to the single side secondary polishing are preferably subjected to final polishing.

The backing pad is preferably composed of hydrophobic foamed material. The difference ($T_1-T_2$) between the thickness ($T_1$) of the backing pad when the load of 300 gf/cm$^2$ is applied thereto and the thickness ($T_2$) of the backing pad when the load of 1800 gf/cm$^2$ is applied thereto is preferably 1 to 100 μm. There are preferably formed in the wafer holding surface of the backing pad pores of 10 to 30 μm in their diameter.

For the backing pad, there is preferably 1 μm or less when the load of 300 gf/cm$^2$ is applied thereto for 1 minute the difference ($TV_5$) between maximum and minimum in thickness at total five points of its central point and four points positioned 5 mm inwardly away from its circumferential edge along its two diameters crossing at right angles.

The backing pad is preferably made by surface grinding the wafer holding surface of the backing pad which is bonded to the carrier plate with the wafer holding surface being up by using a precise surface grinding machine to such a thickness variation level that when the load of 300 gf/cm$^2$ is applied thereto for 1 minute the difference ($TV_5$) between maximum and minimum in thickness at total five points of its central point and four points positioned 5 mm inwardly away from its circumferential edge along its two diameters crossing at right angles is 1 μm or less.

It is preferable to provide a space of 0.5 to 1.5 mm between the circumferential inner edge of the wafer receiving hole of the template and the circumferential outer edge of the backing pad.

The above and other objects, features and advantages of the present invention will become manifest to those skilled in the art upon making reference to the detailed description and the accompanying sheets of drawings.

DETAILED DESCRIPTION OF THE INVENTION

The present invention will be described below in greater detail by way of the following embodiments which should be construed as illustrative rather than restrictive.

Figure 5:
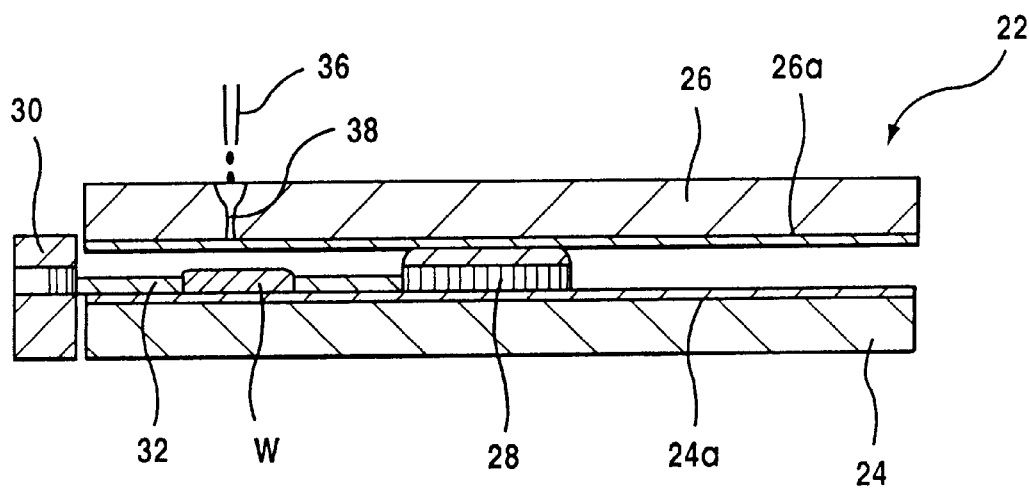
FIG. 5 is a cross sectional schematic view of a double side polishing machine.
Figure 6:
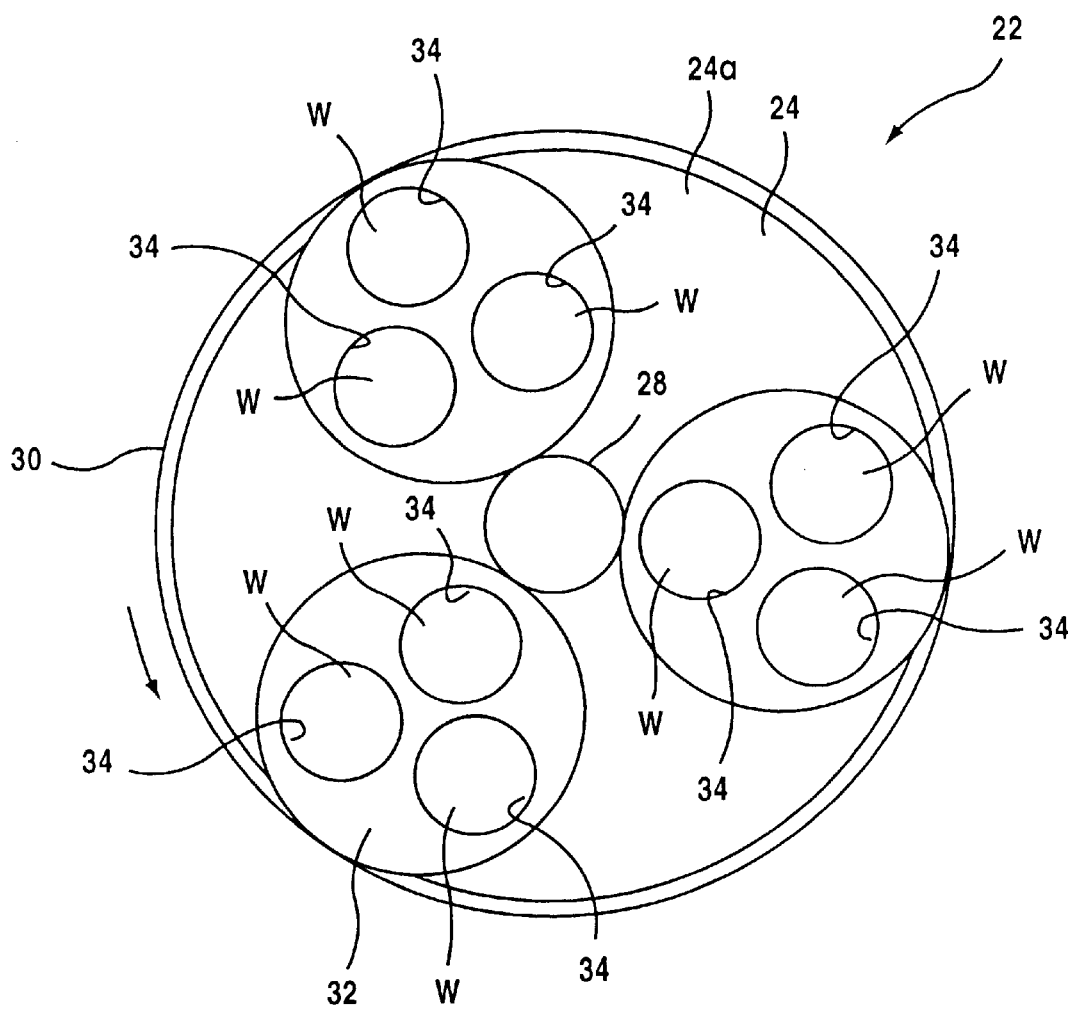
FIG. 6 is a schematic plan view showing a double side polishing machine in which an upper polishing plate is removed.

A method of polishing semiconductor wafers according to the present invention comprises two polishing steps of a primary double side polishing step and a secondary single side polishing step. The primary double side polishing may be carried out with the conventional double side polishing machine 2 shown in FIGS. 5 and 6. The construction and operation of the double side polishing machine 2 is stated before and hence the explanation thereon is not repeated.

Figure 1:
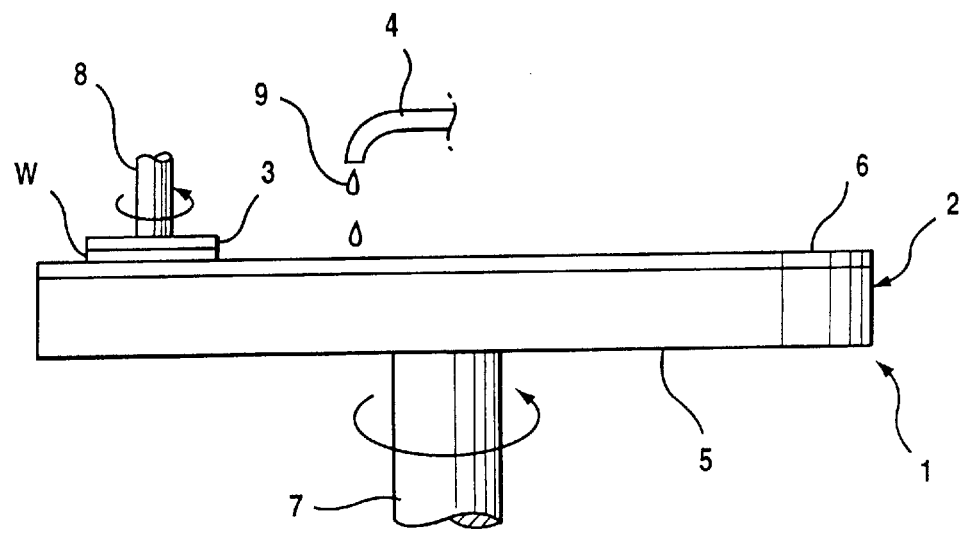
FIG. 1 is an explanatory schematic side view showing one embodiment of a single side polishing machine used in the present invention.

The secondary single side polishing step is carried out with a single side polishing machine shown in FIG. 1. In FIG. 1, the polishing machine 1 comprises a turn table assembly 2, a wafer holder 3, and a polishing agent supplying member 4. The turn table assembly 2 comprises a turn table 5 and a polishing pad 6 adhered on the upper surface of the turn table 5. The turn table 5 can rotate on a shaft 7 at a predetermined rotation speed by a driving device such as a motor. The wafer holder 3 is for holding with the construction described later to carry the wafer (W) on the polishing pad 6 of the turn table assembly 2 so that the surface of the wafer (W) faces to the polishing pad 6. The wafer holder 3 can rotate on a shaft 8 at a predetermined rotation speed and horizontally move on the polishing pad 6 by an appropriate driving device such as a motor. During operation of the polishing machine 1, the wafer (W) held by the wafer holder 3 is in contact with the polishing pad 6 and proper polishing loads are applied to the wafer (W) in a downward direction through the shaft 8 and the wafer holder 3. The polishing agent supplying member 4 is for supplying a polishing agent 9 on the polishing pad 6 to supply it between the wafer (W) and the polishing pad 6.

Figure 2:
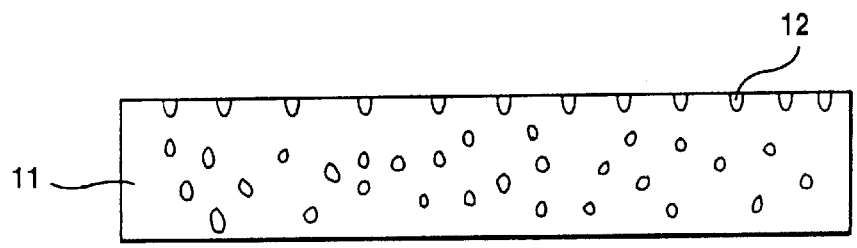
FIG. 2 is a structural section of a backing pad of the single side polishing machine shown in FIG. 1.

The wafer holder 3 includes a characteristic backing pad 11 (FIG. 2). The backing pad 11 is composed of hydrophobic foamed material and a lot of pores 12 are formed on the surface thereof. The wafer (W) is held to the backing pad with the surface tension of water. A thin film of water is produced on the surface of the backing pad 11, the bonding power between the wafer (W) and the backing pad 11 decreases, and while polishing, the wafer (W) rotates idle occasionally. In order to prevent this idle rotation of the wafer (W), the backing pad 11 is composed of hydrophobic material.

The diameter of the pore 12 is in the range of 10 to 30 μm. When the pore diameter is in excess of 30 μm, the bonding power to the wafer (W) decreases, so that while polishing, slip, idle rotation or the like movement of the wafer (W) occurs with a poor polishing result. On the other hand, when the pore diameter is less than 10 μm, the bonding power to the wafer (W) increases but air sandwiched between the backing pad 11 and the wafer (W) bonded thereto does not come off and hence conducting the polishing of the wafer (W) in this condition leads to a polishing result poor in parallelism.

The backing pad 11 is composed of foamed resin material and has elasticity and proper softness. For the softness of the backing pad 11, there is preferably 1 to 100 μm the difference ($T_1$-$T_2$) between the thickness ($T_1$) of the backing pad 11 when the load of 300 gf/cm$^2$ is applied thereto and the thickness ($T_2$) of the backing pad when the load of 1800 gf/cm$^2$ is applied thereto. The value of the difference ($T_1$-$T_2$) shows the fact that the larger the value of the difference ($T_1$-$T_2$), the softer the backing pad 11, and the smaller the value of the difference ($T_1$-$T_2$), the harder the backing pad 11.

The above-mentioned softness indicates the difference of the compression strain between the compression stress of 300 gf/cm$^2$ and 1800 gf/cm$^2$ and roughly shows the amount corresponding to a reciprocal of the modulus of elasticity. Since 300 gf/cm$^2$ corresponds to the minimum pressure applied to the backing pad 11 when polishing, the softness may indicate the amount corresponding to the reciprocal of the modulus of elasticity under the compression stress when polishing.

When the difference ($T_1$-$T_2$) is less than 1 μm, the backing pad 11 is so hard that the bonding power to the wafer (W) decreases, and while polishing, slip, idle rotation or the like movement of the wafer (W) occurs with a poor polishing result. When dust particles which exist in the atmosphere or so are sandwiched between the backing pad 11 and the wafer (W), defective dimples are generated on the wafer surface because the hard backing pad 11 can not absorb varied shapes of the dust particles. When the difference ($T_1$-$T_2$) is in the range of 1 to 100 μm, the dust particles sandwiched between the backing pad 11 and the wafer (W) are absorbed by change in the configuration of the backing pad 11, so the generation of defective dimples in the front side of the wafer advantageously decreases. When the difference ($T_1$-$T_2$) is in excess of 100 μm, the backing pad 11 of foamed resin material is so soft that it is difficult to achieve required processing precision such as precise surface grinding of the backing pad 11 and obtain the backing pad 11 excellent in parallelism.

The backing pad 11 has such a thickness variation level that when the load of 300 gf/cm$^2$ is applied thereto for 1 minute the difference ($TV_5$) between maximum and minimum in thickness measured with a constant pressure thickness measuring instrument at total five points of its central point and four points positioned 5 mm inwardly away from its circumferential edge along its two diameters crossing at right angles is 1 μm or less. The backing pad 11 has elasticity uniform in the whole surface thereof and is capable of mirror polishing excellent in parallelism and flatness.

The backing pad 11 is of disc shape and the outer diameter thereof is nearly equal to that of the wafer (W). The difference between the outer diameter of the wafer (W) and the inner diameter of a wafer receiving hole 18 of a template 16 (FIG. 4) is preferably 1 μm or less.

There is one example of the methods of manufacturing the backing pad 11 wherein hydrophobic foamable resin material such as polyether urethanes is coated on a film and after the coated resin material is foamed the surface of the coated and foamed resin material is ground. The backing pad 11 manufactured by this method may be used after peeling off the film from the coated and foamed resin material or without peeling off the film. It is also possible to use the foamed material manufactured by any methods other than this method.

Figure 3:
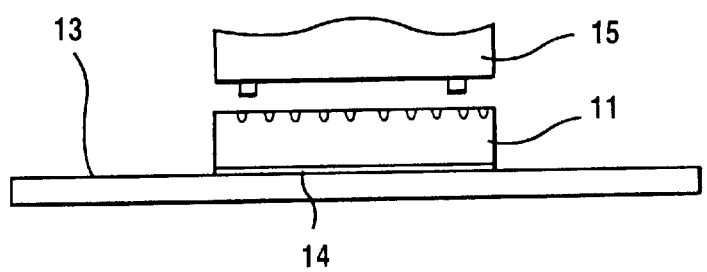
FIG. 3 is a sectional view showing one embodiment of precise surface polishing of the backing pad shown in FIG. 2.

Since it is demanded that the wafer holding surface of the backing pad 11 is perfectly flat when polishing the wafer (W), the wafer holding surface is desirably surface ground with high precision. The backing pad 11 is surface ground in such a state that the backing pad 11 is adhered to a carrier plate 13 with adhesive 14, the wafer holding surface thereof being up as shown in FIG. 3.

As for the precise surface grinding of the backing pad 11, the wafer holding surface thereof is surface ground precisely by using a surface grinding machine 15 having a cup wheel where abrasive grains such as diamond of average grain size of 50 to 100 μm harder than the backing pad 11 are solidified with sintered metals or the like and introduced into the surface thereof. The above-mentioned surface grinding is conducted to achieve such a thickness variation level that when the load of 300 gf/cm$^2$ is applied to the backing pad for 1 minute the difference ($TV_5$) between maximum and minimum in thickness of the backing pad at total five points of its central point and four points positioned 5 mm inwardly away from its circumferential edge along its two diameters crossing at right angles is 1 μm or less.

Figure 4:
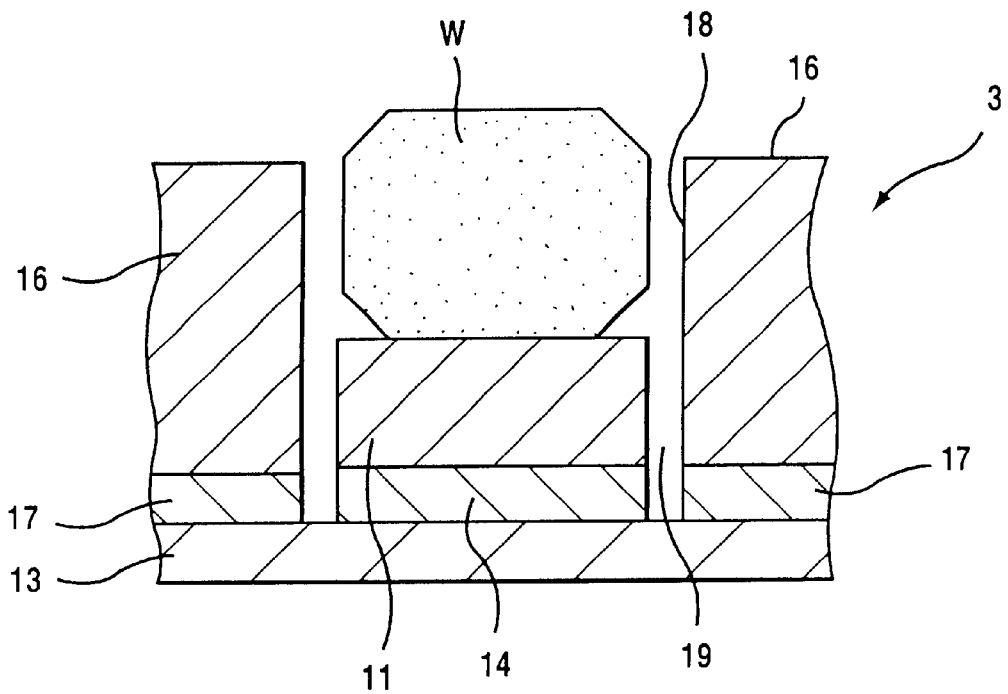
FIG. 4 is a sectional view showing a wafer holder using the backing pad shown in FIG. 2.

The backing pad 11, the wafer holding surface of which is precisely surface ground, is adhered to the carrier plate 13 so as to make the wafer holder 3. As shown in FIG. 4, the template 16 having one or more wafer receiving holes 18 for fittingly receiving respectively therein the wafers (W) is adhered to the carrier plate 13 with adhesive 17. As the back side of the wafer (W) is held with the backing pad 11, the backing pad 11 is disposed in the wafer receiving hole 18. A space 19 is provided between the circumferential inner edge of the wafer receiving hole 18 of the template 16 and the circumferential outer edge of the backing pad 11 in consideration of the fact that while polishing of the wafer (W) the backing pad 11 is laterally spread due to polishing pressure. The space 19 is preferably in the range of 0.5 to 1.5 mm. That is, it is preferable to fittingly determine the space 19 within the range of 0.5 to 1.5 mm in accordance with hardness of the backing pad 11 and the conditions of polishing pressure while polishing in consideration of spread due to compression deformation of the backing pad 11. When the space 19 is less than 0.5, since the backing pad 11 comes into contact with the template 16 while polishing of the wafer (W), the circumferential outer part of the wafer holding surface of the backing pad 11 swells and hence it is impossible to polish the wafer (W) to uniform thickness. When the space 19 is more than 1.5 mm, the back side of the wafer (W) gets out of the place to be inserted or slips out from the backing pad 11 due to the vibration during polishing.

The template 16 necessarily has flatness and parallelism. The wafer (W) is chucked to the backing pad 11 during polishing. For this chucking operation, after water is coated on the wafer holding surface of the backing pad 11 and excessive water on the surface is removed, the wafer (W) is chucked to the backing pad 11 while pressing down the central portion of the wafer (W) so as to prevent air from getting into the interface between the wafer holding surface of the backing pad 11 and the wafer (W).

Thus, there can be obtained the wafer (W) excellent in parallelism and flatness by polishing the wafer (W) which is held with the wafer holder 3 of FIG. 4. Besides the wafer holder 3 of batch polishing type wherein a plurality of wafers are held for a carrier plate 13 as shown in FIG. 4, there may be used a wafer holder of single wafer polishing type wherein a wafer is held for a carrier plate. The wafer holder 3 of batch polishing type (FIG. 4) can be advantageously used to improve the productivity in a polishing process as against the one of single wafer polishing type.

After the completion of the secondary single side polishing step, if necessary, the front side of the wafer (W) is subjected to final polishing. This final polishing may be, as a matter of course, carried out in the secondary single side polishing step.

As stated above, the present invention makes it to possible to hold a plurality of wafers at one time due to batch processing to thereby improve the productivity. According to the present invention, the generation of the defective dimples in the front side of the wafer decreases extremely because the backing pad which does not use wax for holding the wafer is soft. Compared with conventional single side polishing, the flatness level of the wafer polished with the double side polishing machine in the present invention is improved.

Obviously, various minor changes and modifications of the present invention are possible in the light of the above teaching.

It is therefore to be understood that within the scope of the appended claims the invention may be practiced otherwise than as specifically described.

What is claimed is:

1. A method of polishing semiconductor wafers which comprises the steps of:
   (a) double side primary polishing of both front and back sides of semiconductor wafers using a double side polishing machine; and
   (b) single side secondary polishing of the front sides of the double side polished wafers using a single side polishing machine while holding the back sides of the wafers with a wafer holder including a template so bonded on a carrier plate as having one or more wafer receiving holes in which backing pads are disposed respectively for holding the back sides of the respective wafers fittingly received therein.

2. A method of polishing semiconductor wafers according to claim 1, wherein after (b) the single side secondary polishing step has been completed, the front sides of the wafers subjected to the single side secondary polishing are subjected to final polishing.

3. A method of polishing semiconductor wafers according to claim 1, wherein the backing pad is composed of hydrophobic foamed material, the difference ($T_1-T_2$) between the thickness ($T_1$) of the backing pad when the load of 300 $gf/cm^2$ is applied thereto and the thickness ($T_2$) of the backing pad when the load of 1800 $gf/cm^2$ is applied thereto is 1 to 100 $\mu m$, and pores of 10 to 30 $\mu m$ in their diameter are formed in the wafer holding surface of the backing pad.

4. A method of polishing semiconductor wafers according to claim 2, wherein the backing pad is composed of hydrophobic foamed material, the difference ($T_1-T_2$) between the thickness ($T_1$) of the backing pad when the load of 300 $gf/cm^2$ is applied thereto and the thickness ($T_2$) of the backing pad when the load of 1800 $gf/cm^2$ is applied thereto is 1 to 100 $\mu m$, and pores of 10 to 30 $\mu m$ in their diameter are formed in the wafer holding surface of the backing pad.

5. A method of polishing semiconductor wafers according to claim 1, wherein when the load of 300 $gf/cm^2$ is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 $\mu m$ or less.

6. A method of polishing semiconductor wafers according to claim 2, wherein when the load of 300 $gf/cm^2$ is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 $\mu m$ or less.

7. A method of polishing semiconductor wafers according to claim 3, wherein when the load of 300 $gf/cm^2$ is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 $\mu m$ or less.

8. A method of polishing semiconductor wafers according to claim 1, wherein the backing pad is made by surface grinding of the wafer holding surface of the backing pad which is bonded to the carrier plate with the wafer holding surface being up by using a precise surface grinding machine to such a thickness variation level that when the load of 300 $gf/cm^2$ is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 $\mu m$ or less.

9. A method of polishing semiconductor wafers according to claim 2, wherein the backing pad is made by surface grinding of the wafer holding surface of the backing pad which is bonded to the carrier plate with the wafer holding surface being up by using a precise surface grinding machine to such a thickness variation level that when the load of 300 $gf/cm^2$ is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 $\mu m$ or less.

10. A method of polishing semiconductor wafers according to claim 3, wherein the backing pad is made by surface grinding of the wafer holding surface of the backing pad which is bonded to the carrier plate with the wafer holding surface being up by using a precise surface grinding machine to such a thickness variation level that when the load of 300 gf/cm² is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 µm or less.

11. A method of polishing semiconductor wafers according to claim 4, wherein the backing pad is made by surface grinding of the wafer holding surface of the backing pad which is bonded to the carrier plate with the wafer holding surface being up by using a precise surface grinding machine to such a thickness variation level that when the load of 300 gf/cm² is applied to the backing pad for 1 minute, the difference ($TV_5$) between maximum and minimum in thickness at total five points of the central point of the backing pad and the four points positioned 5 mm inwardly away from the circumferential edge of the backing pad along two diameters of the backing pad crossing at right angles is 1 µm or less.

12. A method of polishing semiconductor wafers according to claim 1, wherein a space of 0.5 to 1.5 mm is provided between the circumferential inner edge of the wafer receiving hole of the template and the circumferential outer edge of the backing pad.

13. A method of polishing semiconductor wafers according to claim 2, wherein a space of 0.5 to 1.5 mm is provided between the circumferential inner edge of the wafer receiving hole of the template and the circumferential outer edge of the backing pad.

14. A method of polishing semiconductor wafers according to claim 3, wherein a space of 0.5 to 1.5 mm is provided between the circumferential inner edge of the wafer receiving hole of the template and the circumferential outer edge of the backing pad.

15. A method of polishing semiconductor wafers according to claim 4, wherein a space of 0.5 to 1.5 mm is provided between the circumferential inner edge of the wafer receiving hole of the template and the circumferential outer edge of the backing pad.

16. A method of polishing semiconductor wafers according to claim 5, wherein a space of 0.5 to 1.5 mm is provided between the circumferential inner edge of the wafer receiving hole of the template and the circumferential outer edge of the backing pad.

* * * * *